US009111815B2

United States Patent
Hui et al.

(10) Patent No.: US 9,111,815 B2
(45) Date of Patent: Aug. 18, 2015

(54) PIXEL STRUCTURE, LCD PANEL, AND MANUFACTURING METHOD THEREOF

(75) Inventors: Guanbao Hui, Beijing (CN); Seungjin Choi, Beijing (CN); Weifeng Zhou, Beijing (CN); Feng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 35 days.

(21) Appl. No.: 13/478,541

(22) Filed: May 23, 2012

(65) Prior Publication Data

US 2012/0307171 A1 Dec. 6, 2012

(30) Foreign Application Priority Data

May 30, 2011 (CN) .......................... 2011 1 0143765

(51) Int. Cl.
G02F 1/1335 (2006.01)
H01L 27/12 (2006.01)
G02F 1/1368 (2006.01)

(52) U.S. Cl.
CPC .......... H01L 27/1288 (2013.01); G02F 1/1368 (2013.01); G02F 1/133555 (2013.01); H01L 27/124 (2013.01)

(58) Field of Classification Search
CPC .................. G02F 1/133555; G02F 1/133553
USPC ....................................................... 349/114
See application file for complete search history.

(56) References Cited

U.S. PATENT DOCUMENTS

| 5,940,154 A | 8/1999 | Ukita et al. | |
| 2003/0132443 A1* | 7/2003 | Kim ............................... | 257/79 |
| 2003/0156240 A1* | 8/2003 | Oda et al. ...................... | 349/113 |
| 2004/0014834 A1 | 1/2004 | Shiiki et al. | |
| 2004/0125288 A1 | 7/2004 | Jeong et al. | |
| 2007/0247574 A1* | 10/2007 | Kudo ............................ | 349/114 |

(Continued)

FOREIGN PATENT DOCUMENTS

| CN | 1388574 A | 1/2003 |
| CN | 1468383 A | 1/2004 |

(Continued)

OTHER PUBLICATIONS

First Chinese Office Action dated Feb. 8, 2014; Appln. No. 201110143765.7.

(Continued)

*Primary Examiner* — Michael Caley
*Assistant Examiner* — Edmond Lau
(74) *Attorney, Agent, or Firm* — Ladas & Parry LLP

(57) ABSTRACT

An embodiment of the disclosed technology provides a pixel structure, comprising a TFT, a reflective region and a transmissive region, wherein the reflective region comprises a reflective region insulation layer, a reflection layer on the reflective region insulation layer and a reflective region pixel electrode on the reflection layer, and the transmissive region comprises a transmissive region pixel electrode, wherein the reflective region pixel electrode and the transmissive region pixel electrode form an integral structure, and the integral structure of the pixel electrodes is connected with the drain electrode of the TFT, wherein the organic layer in the reflective region is formed on an array substrate prior to a gate electrode of the TFT, and the reflection layer in the reflective region and the gate electrode of the TFT are formed in a same patterning process by using a same metal layer.

13 Claims, 2 Drawing Sheets

(56) References Cited

U.S. PATENT DOCUMENTS

| | | | |
|---|---|---|---|
| 2008/0169473 A1* | 7/2008 | Cho | 257/72 |
| 2009/0191653 A1* | 7/2009 | Lee | 438/29 |
| 2010/0053517 A1 | 3/2010 | Imai et al. | |

FOREIGN PATENT DOCUMENTS

| | | | |
|---|---|---|---|
| CN | 1514276 A | | 7/2004 |
| CN | 1983558 A | * | 6/2007 |
| CN | 19083558 A | | 6/2007 |
| CN | 101663612 A | | 3/2010 |
| TW | 449669 B | | 8/2001 |

OTHER PUBLICATIONS

Second Chinese Office Action dated Jul. 2, 2014; Appln. No. 201110143765.7.

* cited by examiner

PIXEL STRUCTURE, LCD PANEL, AND MANUFACTURING METHOD THEREOF

BACKGROUND

Embodiments of the disclosed technology relate to a pixel structure, a liquid crystal display (LCD) panel and a manufacturing method of an LCD panel.

The thin film transistor liquid crystal displays (TFT-LCDs) currently widely applied are mostly of a full-transmissive type. The full-transmissive type LCDs have a poor contrast when used outdoor for example in the sunshine, resulting in bad panel readability. To overcome this defect, a transflective LCD has been proposed. The transflective LCD improves the contrast of the outdoor LCD by increasing the reflectivity of the panel so that the panel may keep a good outdoor readability.

As shown in FIG. 1, a pixel structure (that is, the structure of a pixel) on an base substrate 001 of a conventional transflective LCD comprises: a gate electrode 11 of a thin film transistor (TFT), a gate insulating layer 12, an active layer 13, source/drain electrodes 14/15 of the TFT, a passivation layer 16, an organic layer 17, a pixel electrode 18 and a reflection layer 19. Such a pixel structure may be divided into three regions, i.e., a TFT region, a reflective region, and a transmissive region. A manufacturing method for the pixel structure shown in FIG. 1 may comprise the following steps.

Step 1 of preparing a gate metal film on a base substrate, and forming the gate electrode 11 and a gate line through a photolithography process using a mask;

Step 2 of preparing a silicon nitride film on the array substrate after step 1 to form the gate insulating layer 12 and preparing a semiconductor film to form the active layer 13 through a photolithography process using a mask;

Step 3 of preparing a source/drain metal film on the array substrate after step 2, and forming a date line and the source electrode 14 and the drain electrode 15 of the TFT through a photolithography process using a mask;

Step 4 of preparing a silicon nitride film on the array substrate after step 3, and forming the passivation layer 16 by forming a via hole in the silicon nitride film through a photolithography process using a mask;

Step 5 of preparing an organic film on the array substrate after step 4, and forming the organic layer 17 through a photolithography process using a gray tone mask;

Step 6 of preparing a pixel electrode film on the array substrate after step 5, and forming the pixel electrode 18 through a photolithography process using a mask; and Step 7 of preparing a reflective metal film on the array substrate after step 6, and forming the reflection layer 19 through a photolithography process using a mask.

It can be seen from the above manufacturing process that seven photolithography processes are adopted in the conventional manufacturing method for the pixel structure shown in FIG. 1, which results in a complex process.

SUMMARY

An embodiment of the disclosed technology provides a pixel structure, comprising a thin film transistor (TFT), a reflective region and a transmissive region, wherein the reflective region comprises a reflective region insulation layer, a reflection layer on the reflective region insulation layer and a reflective region pixel electrode on the reflection layer, and the transmissive region comprises a transmissive region pixel electrode, wherein the reflective region pixel electrode and the transmissive region pixel electrode form an integral structure, and the reflection layer in the reflective region and the gate electrode of the TFT are formed in a same patterning process by using a same metal layer.

Another embodiment of the disclosed technology provides an LCD panel, comprising an array substrate, a color filter substrate and a liquid crystal layer interposed therebetween, wherein the array substrate comprise a pixel structure, the pixel structure comprising: a thin film transistor (TFT), a reflective region and a transmissive region, wherein the reflective region comprises a reflective region insulation layer, a reflection layer on the reflective region insulation layer and a reflective region pixel electrode on the reflection layer, and the transmissive region comprises a transmissive region pixel electrode, wherein the reflective region pixel electrode and the transmissive region pixel electrode form an integral structure, and the reflection layer in the reflective region and the gate electrode of the TFT are formed in a same patterning process by using a same metal layer.

Further another embodiment of the disclosed technology provides a manufacturing method for a pixel structure, comprising preparing an organic film on a base substrate and forming a reflective region insulation layer through a photolithography process using a mask; preparing a gate metal film on the base substrate and forming a gate electrode of a thin film transistor (TFT), a reflection layer and a gate line through a photolithography process using a mask, wherein the reflection layer is formed on the reflective region layer; sequentially forming a gate insulating layer, an active layer, a source/drain metal layer, a passivation layer, and a reflective region pixel electrode and a transmissive region pixel electrode which form an integral structure.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Figure 1:
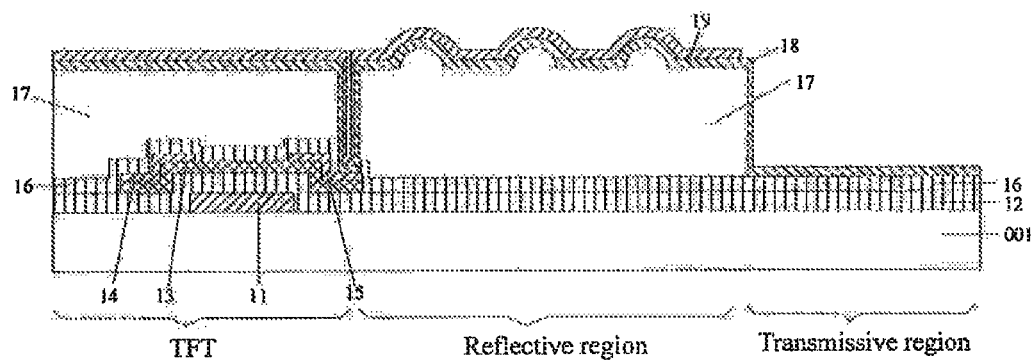
FIG. 1 is a structural diagram of a pixel (pixel structure) of a conventional array substrate.
Figure 2:
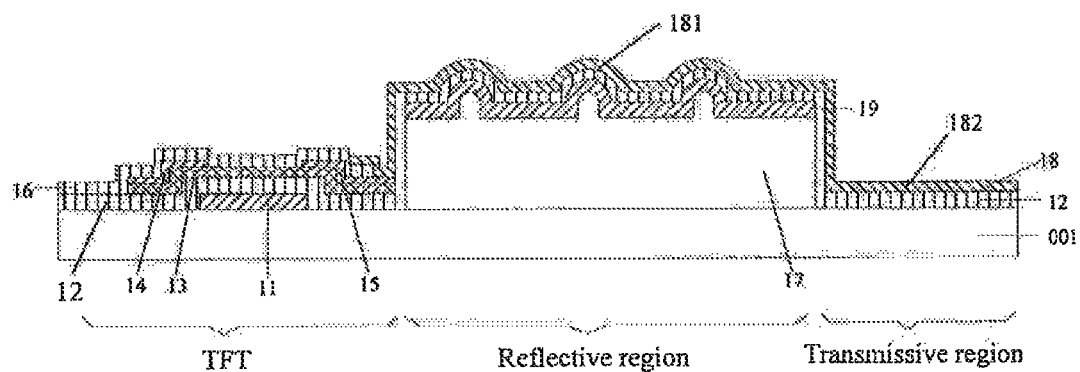
FIG. 2 is a cross-sectional view of a pixel of an array substrate according to an embodiment of the disclosed technology.

The embodiment of the disclosed technology being thus described, it will be obvious that the same may be varied in many ways. Such variations are not to be regarded as a departure from the spirit and scope of the disclosed technology, and all such modifications as would be obvious to those skilled in the art are intended to be included within the scope of the following claims.

To simplify the manufacturing process for the pixel structure of a base substrate 001 for a transflective LCD, a pixel structure according to an embodiment of the disclosed technology is provided as shown in FIG. 2, which comprises a thin film transistor (TFT) region, a reflective region and a transmissive region, which are arranged side by side. The reflective region comprises an organic layer 17 as a reflective region insulation layer, a reflection layer 19, and a reflective region pixel electrode 181. The transmissive region comprises a transmissive region pixel electrode 182. The TFT comprises a gate electrode 11, a gate insulation layer 12, an active layer 13, a source electrode 14, and a drain electrode 15 and is covered by a passivation 16, and the TFT is connected to the pixel electrode 181, 182 through a through hole formed in the passivation layer.

The pixel electrodes 181 and 182 in the reflective region and the transmissive region form pixel electrode 18 of an integral structure. The pixel electrode 18 is connected with the drain electrode 15 of the TFT. The organic layer 17 in the reflective region may be formed on the base substrate 001 prior to the gate electrode 11 of the TFT as an insulation layer in the reflective region to reduce the cell gap. The reflection layer 19 in the reflective region and the gate electrode 11 of the TFT can be formed in a same patterning process by using a same metal layer. The base substrate 001 may be a glass substrate, a plastic substrate, or the like.

The same metal layer may be one of Mo, Cu, Al or AlNd alloy or other alloys. The manufacturing of the gate electrode 11 and the reflection layer 19 in a same patterning process by using a same metal layer comprises preparing a gate metal film on the base substrate 001 having the organic layer 17 formed thereon through depositing or sputtering one of Mo, Cu, Al or AlNd alloy or other alloys, and forming the reflection layer 19 and the gate electrode 11 of the TFT through a photolithography process using one mask. At the same time, a gate line (not shown) is formed, and the gate electrode 11 may be branched from the gate line or a part of the gate line.

As in the pixel structure provided by the embodiment of the disclosed technology, the gate electrode 11 and the reflection layer 19 can be formed in a same patterning process by using a same metal layer, one masking process is thus omitted. The manufacturing process for the pixel structure on the base substrate 001 is simplified compared with the conventional process; thereby the production costs can be saved.

As shown in FIG. 2, only the gate insulating layer 12 is formed (i.e., left) between the pixel electrode 18 and the reflection layer 19 in the reflective region. In the manufacturing of the pixel structure, an insulating film such as a silicon nitride film is firstly prepared as a passivation layer 16 on the base substrate 001 after the source and drain electrodes 14, 15 have been formed thereon, and then the insulating film is patterned by using a mask according to the shape of the passivation layer 16 shown in FIG. 2, thereby the passivation layer 16 shown in FIG. 2 is formed. In this end, between the pixel electrode 18 and the reflection layer 19, the passivation layer 16 is removed but the gate insulating layer 12 is left in the reflective region.

Figure 3:
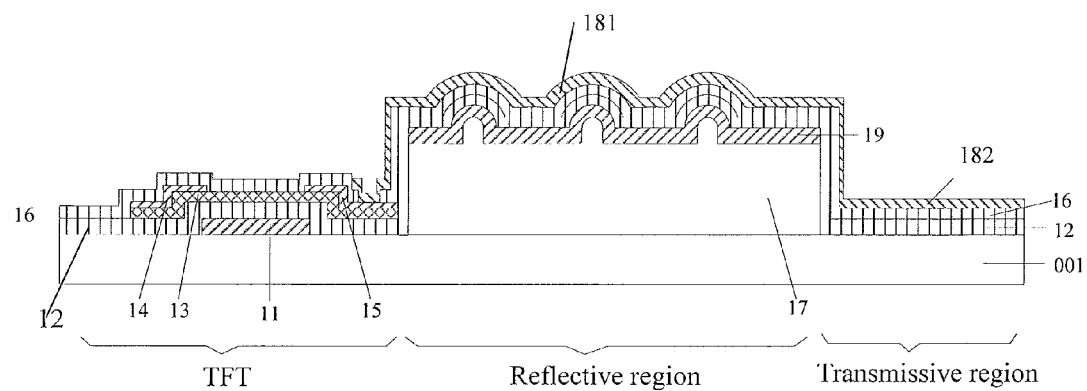
FIG. 3 is a cross-sectional view of another pixel on an array substrate according to an embodiment of the disclosed technology.

Alternatively, both the gate insulating layer 12 and the passivation layer 16 may be formed (i.e., left) between the pixel electrode 18 and the reflection layer 19 in the reflective region. In the manufacturing of such a pixel structure, an insulating film such as a silicon nitride film is firstly prepared as a passivation on the base substrate 001 after the source and drain electrodes 14 and 15 have been formed thereon, and then the insulating film is patterned by using a mask according to the shape of the passivation layer 16 shown in FIG. 3; that is, a via hole is formed, through which the drain electrode 15 of the TFT and the pixel electrode 18 are connected to each other, thereby the passivation layer 16 shown in FIG. 3 is formed. In this end, the gate insulating layer 12 and the passivation layer 16 are formed between the pixel electrode 18 and the reflection layer 19 in the reflective region.

Preferably, the reflection layer 19 has a cross-section of a wave shape, a sawtooth wave shape, or a triangular wave shape, for example. That is, the reflection layer has an uneven surface to enhance the light reflection effect. By forming the reflection layer 19 of such a shape, diffusion reflection of the incident light from outside can occur on the reflection layer 19, such that reflected light can be more evenly distributed on various viewing angles.

The pixel structure shown in FIGS. 2-3 differ from each other in that different masks are used in forming (patterning) the passivation layer, and the manufacturing methods thereof do not have substantial difference. Both exemplary pixel structures can be made according to the following manufacturing method, which comprises the following steps.

Step A1 of preparing an organic film on a base substrate 001, and forming the organic layer 17 through a photolithography process using a mask. The organic layer 17 is an example of the reflective insulation layer for reducing the cell gap in the reflective region.

The photolithography process using a mask (masking process) generally comprises processes such coating of photoresist, exposing and developing of photoresist, etching, removing of photoresist and so on. There may be two available types of photolithography processes using a mask in the embodiment of the disclosed technology, one of which makes use of a normal mask, the other makes use of a gray tone mask (or a half tone mask). The photolithography process using a gray tone or half tone mask is also referred to as a gray tone masking process. A normal mask or a gray tone mask is used in the industrial manufacturing according to practical requirements.

In an example, the step may be performed by preparing an organic film on the base substrate 001, and forming the organic layer 17 having a cross-section profile of a wave shape, a sawtooth wave shape, or a triangular wave shape through a gray tone masking process. In this way, when the reflection layer 19 is formed in the subsequent step A2, the reflection layer 19 can have a section of a wave shape, a sawtooth wave shape, or a triangular wave shape.

Step A2 of preparing a gate metal film on the base substrate 001 after step A1, and forming the gate electrode 11 of the TFT, the reflection layer 19 and a gate line through a photolithography process using a mask.

As one layer of gate metal film is prepared in this step, and then the gate electrode 11 of the TFT, the reflection layer 19 and a gate line are formed through a photolithography process using a mask, thus the gate electrode 11 of the TFT and the reflection layer 19 are formed in a same patterning process by using a same metal layer.

The gate insulating layer 12, the active layer 13, the source/drain metal layer (including source and drain electrodes and a data line), the passivation layer and the pixel electrode 18 are sequentially formed over the base substrate 001 after step A2. The layers following step A2 may be formed according to conventional processes for example as follows.

Step A3 of preparing an insulating film as the gate insulating layer 12 on the resulted base substrate 001 after step A2; preparing a semiconductor film on the array substrate having the gate insulating layer formed thereon and then forming the active layer 13 through a photolithography process using one mask; preparing a source/drain metal film on the base substrate 001 having the semiconductor film formed thereon and forming a source/drain metal layer through a photolithography process using a mask. The source/drain metal layer comprising the source electrode 14 and the drain electrode 15 of the TFT and a data line which may be connected with the source electrode 14.

Step A4 of preparing an insulating film on the resulted base substrate 001 after step A3, and forming the passivation layer 16 shown in FIG. 2 or 3 through a photolithography process using a mask.

The shape and size of the passivation layer 16 shown in FIG. 2 or 3 are for illustration only; the scope of the disclosed technology is not limited thereto.

Step A5 of preparing a pixel electrode film on the resulted base substrate 001 after step 5, and forming the pixel electrode 18 through a photolithography process using a mask.

It can be seen from above, two masking processes are performed in step A3 while only one masking process is performed in each of the other steps. As a result, only six photolithography processes are performed in the above-described manufacturing method for the pixel structure according to the embodiments of the disclosed technology. The number of photolithography processes is reduced by one compared with the conventional technology, thereby the manufacturing process is simplified. In addition, as the number of used masks is reduced, the production costs can be saved.

In addition, to order to further simplify the manufacturing process, the step for forming the active layer 13 and the source/drain metal layer may comprise sequentially preparing a semiconductor film and a source/drain metal film on the base substrate 001 having the gate insulating layer 12 formed thereon and forming the active layer 13 and the source/drain metal layer through a photolithography process using one mask. Specifically, the above step A3 may comprise preparing an insulating film as the gate insulating layer 12 on the resulted base substrate 001 after step A2; preparing a semiconductor film and a source/drain metal film in this order on the base substrate 001 having the gate insulating layer 12 formed thereon, and forming the active layer 13 and the source/drain metal layer through a photolithography process using one gray tone mask. As the active layer 13 and the source/drain metal layer are completed through a photolithography processes using one gray tone mask, the pixel structure according to an embodiment of the disclosed technology may be finished through a photolithography process by using five masks, thereby the manufacturing process is further simplified and the production costs can be further saved.

Figure 4:
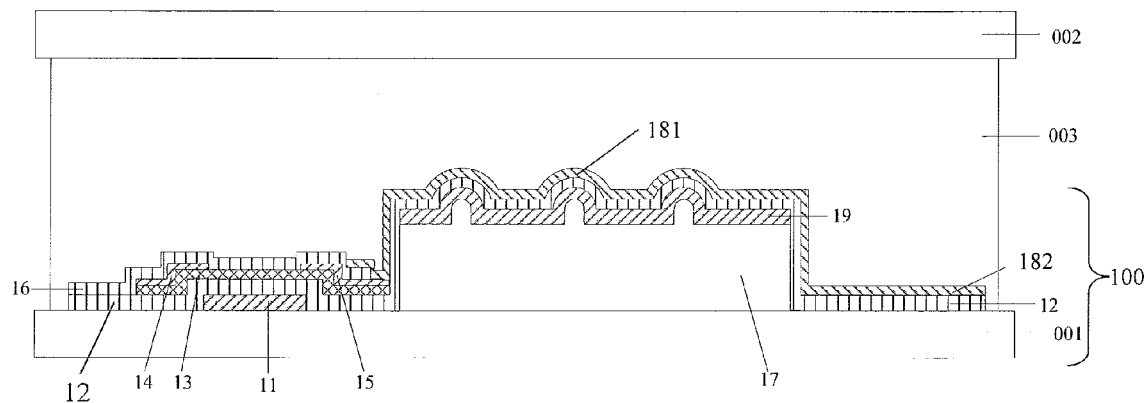
FIG. 4 is a cross-sectional view of an LCD panel according to an embodiment of the disclosed technology.

As shown in FIG. 4, an embodiment of the disclosed technology provides an LCD panel comprising an array substrate 100, a color filter substrate 002 and a liquid crystal layer 003 interposed therebetween. The array substrate 300 has a pixel structure formed on a base substrate 001, which comprises a TFT, a reflective region and a transmissive region. The reflective region comprises an organic layer 17 as a reflective region insulation layer, a reflection layer 19, and a pixel electrode 181. The transmissive region comprises the pixel electrode 182.

The pixel electrodes 181 and 182 in the reflective region and the transmissive region form a pixel electrode of an integral structure. The pixel electrode of the integral structure is connected with the drain electrode 15 of the TFT. The organic layer 17 in the reflective region may be formed on the base substrate 001 prior to the gate electrode 11 of the TFT.

The reflection layer 19 in the reflective region and the gate electrode 11 of the TFT are formed in a same patterning process by using a same metal layer.

Preferably, the reflection layer 19 has a section of a wave shape, a sawtooth wave shape, or a triangular wave shape. That is, the reflection layer 19 has an uneven surface.

The array substrate 100 of the LCD panel shown in FIG. 4 is obtained with reference to FIG. 2. However, it can also be obtained with reference to FIG. 3. As shown in FIG. 2, the gate insulating layer 12 is left between the pixel electrode 18 and the reflection layer 19 in the reflective region. As shown in FIG. 3, both the gate insulating layer 12 and the passivation layer 16 are left between the pixel electrode 18 and the reflection layer 19 in the reflective region.

According to the LCD panel of an embodiment of the disclosed technology, the gate electrode 11 of the TFT and the reflection layer 19 are formed in a same patterning process using a same metal layer in the manufacturing of the pixel structure on the base substrate 001. As a result, one masking process can be omitted. The manufacturing process for the pixel structure on the base substrate 001 can be simplified; thereby the production costs can be saved.

It should be appreciated that the embodiments described above are intended to illustrate but not limit the disclosed technology. Although the disclosed technology has been described in detail herein with reference to the preferred embodiments, it should be understood by those skilled in the art that the disclosed technology can be realized with different material and equipment as necessary, and that various modification and equivalents thereof can be made herein without departing from the spirit and scope of the disclosed technology.

What is claimed is:

1. A pixel structure, comprising
a thin film transistor (TFT), a reflective region and a transmissive region,
wherein the reflective region comprises a reflective region insulation layer, a reflection layer on the reflective region insulation layer and a reflective region pixel electrode on the reflection layer, and the transmissive region comprises a transmissive region pixel electrode,
wherein the reflective region pixel electrode and the transmissive region pixel electrode form an integral structure,
the reflection layer in the reflective region and the gate electrode of the TFT are formed in a same patterning process by using a same metal layer, and
wherein a gate insulating layer is formed between the reflective region pixel electrode and the reflection layer in the reflective region.

2. The pixel structure of claim 1, wherein both a gate insulating layer and a passivation layer are formed between the reflective region pixel electrode and the reflection layer in the reflective region, and the passivation layer covers a source/drain metal layer.

3. The pixel structure of claim 1, wherein the reflection layer has a cross-section of a wave shape, a sawtooth wave shape, or a triangular wave shape.

4. The pixel structure of claim 1, wherein the reflective region insulation layer is an organic layer.

5. A liquid crystal display (LCD) panel, comprising:
an array substrate, a color filter substrate and a liquid crystal layer interposed therebetween,
wherein the array substrate comprise a pixel structure, the pixel structure comprising:
a thin film transistor (TFT), a reflective region and a transmissive region, wherein the reflective region comprises a reflective region insulation layer, a reflection layer on the reflective region insulation layer and a reflective region pixel electrode on the reflection layer, and the transmissive region comprises a transmissive region pixel electrode, wherein the reflective region pixel electrode and the transmissive region pixel electrode form an integral structure, the reflection layer in the reflective region and the gate electrode of the TFT are formed in a same patterning process by using a same metal layer, and wherein a gate insulating layer is formed between the reflective region pixel electrode and the reflection in the reflective region.

6. The LCD panel of claim 5, wherein both a gate insulating layer and a passivation layer are formed between the reflective region pixel electrode and the reflection layer in the reflective region, and the passivation layer covers a source/drain metal layer.

7. The LCD panel of claim 5, wherein the reflection layer has a cross-section of a wave shape, a sawtooth wave shape, or a triangular wave shape.

8. The LCD panel of claim 5, wherein the reflective region insulation layer is an organic layer.

9. A manufacturing method for a pixel structure, comprising preparing an organic film on a base substrate and forming a reflective region insulation layer through a photolithography process using a mask;

preparing a gate metal film on the base substrate and forming a gate electrode of a thin film transistor (TFT), a reflection layer and a gate line through a photolithography process using a mask, wherein the reflection layer is formed on the reflective region insulation layer;

sequentially forming a gate insulating layer, an active layer, a source/drain metal layer, a passivation layer, and a reflective region pixel electrode and a transmissive region pixel electrode which form an integral structure, wherein the gate insulating layer is formed between the reflective region pixel electrode and the reflection layer in the reflective region.

10. The method of claim 9, wherein the forming of the active layer and the source/drain metal layer comprises:

preparing a semiconductor film and a source/drain metal film on the base substrate having the gate insulating layer formed thereon, and forming the active layer and the source/drain metal layer through a photolithography process using one mask.

11. The method of claim 9, wherein forming the reflective region insulation layer comprising:

preparing an insulation film on the base substrate, and forming the reflective region insulation layer having a section profile of a wave shape, a sawtooth wave shape, or a triangular wave shape through a gray tone masking process.

12. The method of claim 9, wherein both the gate insulating layer and the passivation layer are formed between the reflective region pixel electrode and the reflection layer in the reflective region, and the passivation layer covers the source/drain metal layer.

13. The method of claim 9, wherein the reflective region insulation layer is an organic layer.

* * * * *